United States Patent [19]
Hsiao et al.

[11] Patent Number: 5,946,568
[45] Date of Patent: Aug. 31, 1999

[54] SELF ALIGNED METHOD OF FABRICATING A DRAM WITH IMPROVED CAPACITANCE

[75] Inventors: Chia-Shun Hsiao, Chung-Hua; Wei-Jing Wen; Wen-Jeng Lin, both of Taipei; Chung-Chih Wang, Tainan, all of Taiwan

[73] Assignee: Mosel Vitelic, Inc., Hsinchu, Taiwan

[21] Appl. No.: 08/649,466

[22] Filed: May 17, 1996

[51] Int. Cl.⁶ .............................................. H01L 21/8242
[52] U.S. Cl. .................... 438/253; 438/254; 438/396; 438/397
[58] Field of Search ................................ 438/253, 254, 438/396, 397

[56] References Cited

U.S. PATENT DOCUMENTS

| | | | |
|---|---|---|---|
| 4,958,318 | 9/1990 | Harari | 365/149 |
| 5,026,657 | 6/1991 | Lee et al. | |
| 5,538,922 | 7/1996 | Cooper et al. | 438/253 |
| 5,565,372 | 10/1996 | Kim | 438/253 |
| 5,580,811 | 12/1996 | Kim | 438/253 |
| 5,792,703 | 11/1998 | Bronner et al. | 438/620 |

Primary Examiner—John F. Niebling
Assistant Examiner—Lynne A. Gurley
Attorney, Agent, or Firm—Tung & Associates

[57] ABSTRACT

A solid state memory fabrication method of DRAM chips with a self-alignment of field plate/BL isolation process includes using oxide-poly-oxide etch followed by oxidation or sidewall deposition (LPTEOS) to isolate the field plate and BL. This process uses a first etchant and a second etchant in etching the BL/N⁺ contact in the fabrication process. During the etch of BL/N⁺ contact (2C etch), a low selectivity etchant etches away Ploy-3 first. This first etchant is applied for approximately one hundred eighty seconds. And then a second etchant process is performed using a high Si selectivity etchant, which etches a way the residual oxide. The second etchant is applied for approximately ninety seconds. The exposed poly on the sidewall is isolated from the contact hole by oxidation or deposition (LPTEOS). The oxide formed on the substrate during oxidation is etched away by anisotropic etch. The self-alignment of BL/3P is thus achieved. The planar area of 2P can be increased by this method and not be limited by the overlap of 2C/3P.

8 Claims, 3 Drawing Sheets

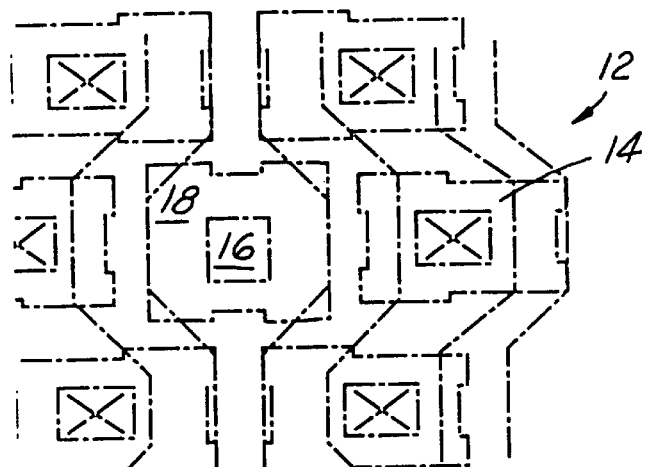
(PRIOR ART) FIG. 1
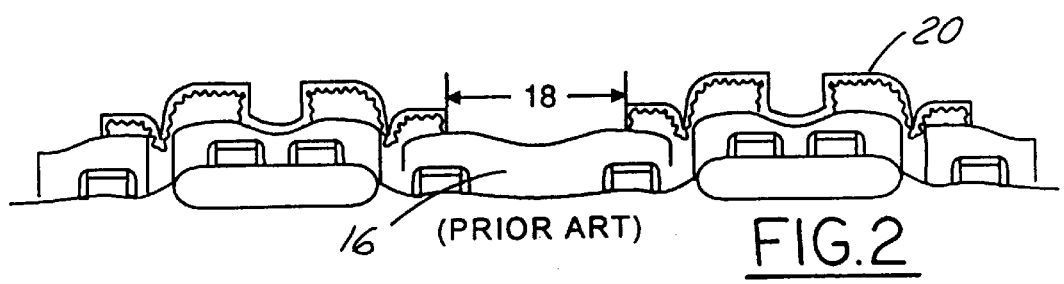
(PRIOR ART) FIG. 2
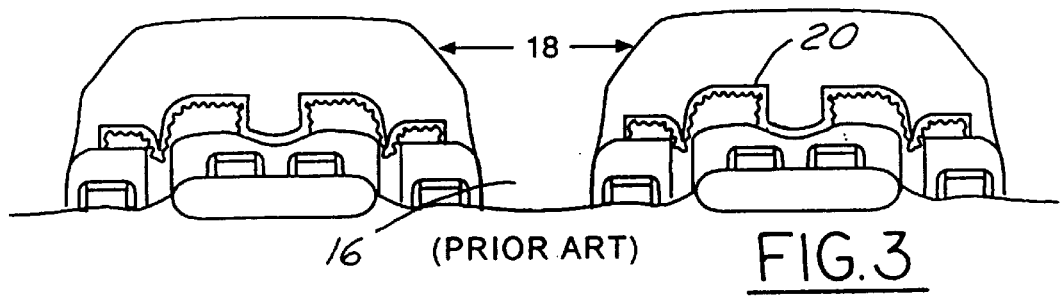
(PRIOR ART) FIG. 3
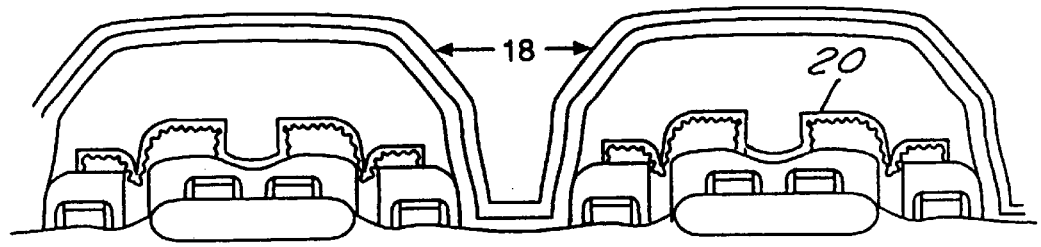
(PRIOR ART) FIG. 4

5,946,568

SELF ALIGNED METHOD OF FABRICATING A DRAM WITH IMPROVED CAPACITANCE

BACKGROUND OF THE INVENTION

1. Field of the Invention

The present invention pertains to solid state memory fabrication and more particularly to fabrication of DRAM chips with self alignment of field plate/BL isolation process by using one step oxide-polysilicon-oxide etch followed by oxidation or sidewall deposition (LPTEOS) to isolate the field plate and BL.

2. Related Prior Art

Prior art has several processes for the manufacture of polysilicon CMOS DRAM chips. In fact, most present day DRAM chips, (Dynamic Random Access Memory), use CMOS or Complementary Metal Oxide Semiconductor technology. Although the term CMOS has a definite meaning, CMOS technology has been applied to any integrated circuit which uses N-channel and P-channel field effect transistors in a complementary manner.

CMOS integrated circuit devices are often referred to as semiconductor devices, however, these devices are fabricated from various materials that are either electrically conductive, nonconductive or semiconductive. Silicon is the most commonly used semiconductor and may be made conductive by doping its elementary crystalline structure with impurities such as boron or arsenic or phosphorus, each having one less or one more valence electron in its outer electron level. Depending on whether one less electron or one more electron is added, the semiconductor will be either P-type material (one less electron) or N-type material (one more electron).

Silicon may be used in either single crystal form or polycrystalline form. Polycrystalline silicon is often referred to as polysilicon. Polysilicon has been used extensively for gates in field effect transistors but is augmented in some instances. When operation speed is a factor, metal with its inherent high conductivity is used to provide a speed increase. This is usually done by placing a layer of refractory metal silicide on the transistor gates to increase speed through high conductivity.

Initially, the CMOS DRAM process begins with a lightly doped P-type or N-type substrate. Subsequently, several, as many as twelve or more, photo resist masking steps take place in the manufacturing process prior to siliciding source and drain regions on the DRAM chip. One representative method of manufacture is described in the U.S. patent described below.

U.S. Pat. No. 5,026,657, titled "Split-Polysilicon CMOS DRAM Process Incorporating Self-Aligned Silicidation Of The Cell Plate, Transistor Gates, and N+ Regions", issued to R. Lee et al., is for a split-polysilicon CMOS DRAM process which incorporates a self-aligned silicidation of the cell plate, transistor gates and N+ regions. By employing a light oxidation step to protect the P-channel transistor sidewall gates from silicidation during a subsequent processing step, the proposed process purports to avoid the problems that may be created by the double etching of the field oxide and active area regions that is required for self-aligned silicidation utilizing a split-polysilicon CMOS process. A protective nitride layer is used to prevent oxidation on those regions which are to be silicided. When this improved process is utilized for DRAM fabrication, the protective nitride layer may also be utilized as the cell dielectric. Although this process precludes the silicidation of the sources and drains of P-channel transistors, silicidation of other important regions is accomplished with very few steps required beyond those required for the basic split-polysilicon CMOS process without self-aligned silicidation of conductive regions.

Referring initially to FIGS. 1 and 2, a plan view of the layout of a typical DRAM chip 12 is illustrated as having 2P area 14, 2C area 16 and 3P window 18 in 3P deposition 20 (see FIG. 2). When design rules become more stringent, the techniques of self-alignment become more useful and critical. In the conventional method, the overlap between the field plate Poly-3 (or 3P) window 18 and the BL/N+ contact area 2C 16 will limit the planar area (or the $X^{-1}$ sectional area) of the storage node Poly-2 14 due to the design rule between the Poly-3 window 18 and the Poly-2 node 14. Therefore, if the self-alignment techniques can be applied on the Poly-3/BL, then the planar area of Poly-2 node 14 can be increased and subsequently, capacitance can be increased. The isolation between Poly-3 and BL can be achieved by oxidation or sidewall deposition (LPTEOS) as illustrated in FIG. 4 to gain electrical insulation. Furthermore, the design rule between the Poly-3/BL is no longer required and the area of Ploy-2 can be increased to increase the capacitance.

For example, using a 0.45 $\mu$m DRAM, the area of Poly-2 is limited by the overlap between 3P deposition 20 and 2P node 14 and the overlap between 2C (BL/N+ contact) and 3P window. In a 0.45 DRAM, 3P–2P overlap is equal to 0.212 $\mu$m and the 2C–3P overlap is equal to 0.273 $\mu$m. When the dimension of the mask CD shrinks even smaller through processing, the area of 2P is also reduced. Therefore, one condition to allow for mask shrinkage is to increase the area of the 2P node 14.

Using the reduction to 0.38 $\mu$m due to shrinkage as an example, the original capacitance is 25 pf (for a 0.45 $\mu$m DRAM). If the memory shrinks to a 0.38 $\mu$m DRAM, then the 2P area will correspondingly become smaller and the capacitance will become smaller to a value less then 18 pf. Therefore, in order to maintain the standard capacitance, the 2P area must be increased. However, the 2P area is limited in a conventional manufacturing process due to consideration of the required overlap of 3P–2P and 2C–3P.

SUMMARY OF THE INVENTION

The present invention pertains to solid state memory fabrication of DRAM chips with self alignment of field plate/BL isolation process by using one step oxide-poly-oxide etch followed by oxidation or sidewall deposition (LPTEOS) to isolate the field plate and BL.

The process of the present invention uses a first etchant and a second etchant in etching the BL/N+ contact in the fabrication process. During the etch of BL/N+ contact (2C etch), a low selectivity etchant of $CHF_3/CF_4$ etches away the Poly-3 layer first. In this first etchant, $CHF_3/CF_4$ has a ratio of approximately 1:5, one part $CHF_3$ to five parts $CF_4$. This first etchant is applied for approximately one hundred eighty seconds. A second etchant process is then performed using a high Si selectivity etchant $CHF_3/CF_4$, which etches away the residual oxide. In this second etchant, $CHF_3/CF_4$ has a ratio of approximately 1:1, one part $CHF_3$ to one part $CF_4$. The second etchant is applied for approximately ninety seconds. The exposed poly on the sidewall is isolated from the contact hole by oxidation or deposition (LPTEOS). The oxide formed on the substrate during oxidation is etched away by anisotropic etch. The self-alignment of BL/3P is thus achieved. The planar area of 2P can be increased by this method and not be limited by the overlap of 2C/3P. Only the 2C–2G overlap needs to be considered. For instance, in a 0.45 μm device, the overlap between 2C–2G is 0.566 μm.

Among the major benefits achieved by the present invention process, the requirements for the photomasking, the etching and the mask removal steps of the 3P layer are eliminated. Moreover, the overlap between 3P–2C is no longer required resulting in a more flexible design rule and a higher device density.

BRIEF DESCRIPTION OF THE DRAWINGS

FIG. 1 is a top view of the layout of a typical conventional DRAM chip.

FIG. 2 is a cross-sectional view of a partially manufactured conventional DRAM chip after a 3P etch.

FIG. 3 is a cross-sectional view of the partially manufactured DRAM chip of FIG. 2 after a 2C etch.

FIG. 4 is a cross-sectional view of the partially manufactured DRAM chip of FIG. 3 after a 4P deposition.

DESCRIPTION OF THE PREFERRED EMBODIMENT

Figure 5:
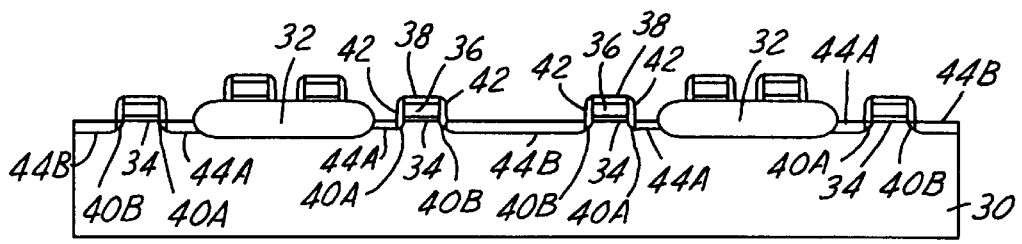
FIG. 5 is a cross-sectional view of the present invention partially manufactured DRAM chip.

Referring now to FIG. 5, a cross-sectional view of a DRAM on which the fabrication method of the present invention is used is shown. On a P type silicon substrate 30 is first formed a field oxide layer 32 to a thickness between about 3000 Å and about 5500 Å by a thermal oxidation process. The field oxide layer 32 is used to isolate the IC devices to be later formed on the substrate 30. A metal oxide field effect transistor consisting of a gate oxide layer 34, a gate electrode 36, sidewall spacers 42, N⁻ lightly doped source 40A/drain 40B, and N⁺ heavily doped source 44A/drain 44B is formed on the P type silicon substrate 30. The gate oxide layer 34 is formed by a thermal oxidation process of the surface layer of the P type silicon substrate 30. It has a thickness between about 50 and about 200 Å. The gate electrode 36 is generally formed by a low pressure chemical vapor deposition (LPCVD) process wherein a polysilicon layer having a thickness between about 1000 and about 3000 Å is first deposited. Subsequently, an oxide layer 38 is formed by a low pressure chemical vapor deposition process from a mixture of reactant gases of tetra-ethoxy-silane (TEOS), nitrogen oxide ($N_2O$) and oxygen. The reaction temperature is about 720° C. and the chamber pressure is between about 200 and about 300 mTorr. The oxide layer 38 having a thickness of between about 500 and about 1200 Å is deposited. After the deposition of the oxide layer 38, photolithography and etching processes are carried out to etch away the oxide layer 38 and the polysilicon layer 36 to form gate 36. An ion implantation process utilizing phosphorus ($P^{31}$) ions is performed to form the N⁻ lightly doped source 40A/drain 40B. The implantation dosage is used between about 1E 13 and about 3E 14 ions/cm². The implantation energy used is between about 20 and about 50 teev.

In the next processing step, a dielectric layer (not shown) is deposited and etched by an isotropic etching process to form the sidewall spacer 42 on the gate electrode 36. The dielectric layer is generally deposited of silicon dioxide by a low pressure chemical vapor deposition process. A reactant gas mixture of TEOS, $N_2O$ and $O_2$ is used at a reaction temperature of about 720° C. and at a chamber pressure between about 200 and about 300 mTorr. The thickness of the dielectric layer deposited is between about 500 Å and about 1500 Å. An ion implantation technique is then used to form N⁺ heavily doped source 44A/drain 44B with arsenic ions of $As^{75}$. The ion dosage used is between about 1E15 and about 3E16 ions/cm². The ion implantation energy used is between about 30 and about 90 teev. This completes the fabrication process for the metal oxide field effect transistor as shown in FIG. 5.

Figure 6:
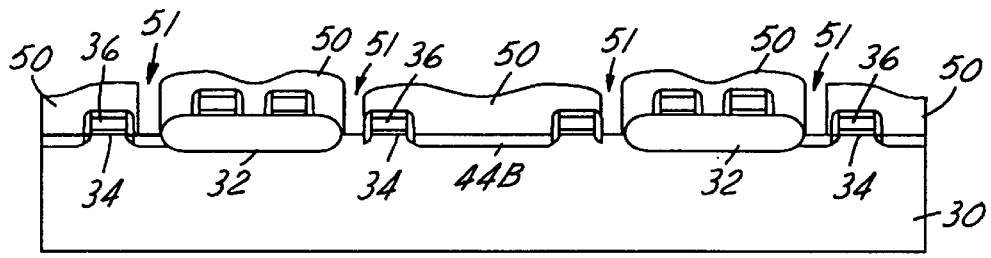
FIG. 6 is a cross-sectional view of the present invention partially manufactured DRAM chip of FIG. 5 after the deposition and etchback of a BPSG layer.

In the next fabrication step, a first insulating layer 50 is deposited and then etched by photolithography and plasma etching processes to form the source contact windows 51 (node contact) at the capacitor regions. This is shown in FIG. 6. In a future processing step, the storage node of the capacitor is electrically connected to the source region 44A of the transistor through the source contact window 51. The first insulating layer 50 is generally formed by a low pressure chemical vapor deposition process of a non-doped silicon oxide (or netural silicate glass, NSG). A mixture of reactant gases of TEOS, $N_2O$ and $O_2$ is used. The deposition reaction is conducted at a chamber temperature of about 720° C. and a chamber pressure between about 200 and about 300 mTorr, to a thickness between about 1000 and about 2000 Å. The plasma etching of the first insulating layer 50 can be carried out by a magnetic enhanced reactive ion etching (MERIE) technique, an electron cyclotron resonance (ECR) technique, or a conventional reactive ion etching (RIE) technique. In the fabrication of semiconductor devices in the sub-micron range, the magnetic enhanced reactive ion etching technique which utilizes plasma etching gasses such as $CF_4$, $CHF_3$ and Ar is frequently used.

Figure 7:
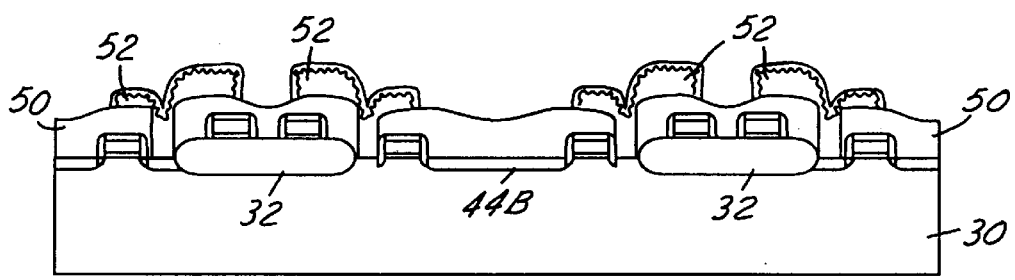
FIG. 7 is a cross-sectional view of the partially manufactured DRAM chip of FIG. 6 after the deposition and etchback of a contact layer.

Next, a first layer of doped polysilicon 52 is deposited to cover the source contact window 51. This is shown in FIG. 7. By utilizing photolithography and plasma etching techniques to etch away the first layer of doped polysilicon 52, storage node of the capacitor is formed. The first doped polysilicon layer 52 can be deposited by utilizing an in-situ phosphorus doped low pressure chemical vapor deposition technique. The reactant gas used is a mixture of $PH_3$ and $SiH_4$. The deposition temperature is between about 520 and about 580° C. to form a first doped polysilicon layer 52 having a thickness between about 3000 and about 7000 Å. The plasma etching process used on the first doped polysilicon layer 52 can be similar to that used on the first insulating layer 50. The plasma reaction gas utilized can be $CCl_4$, $Cl_2$ and HBr.

Figure 8:
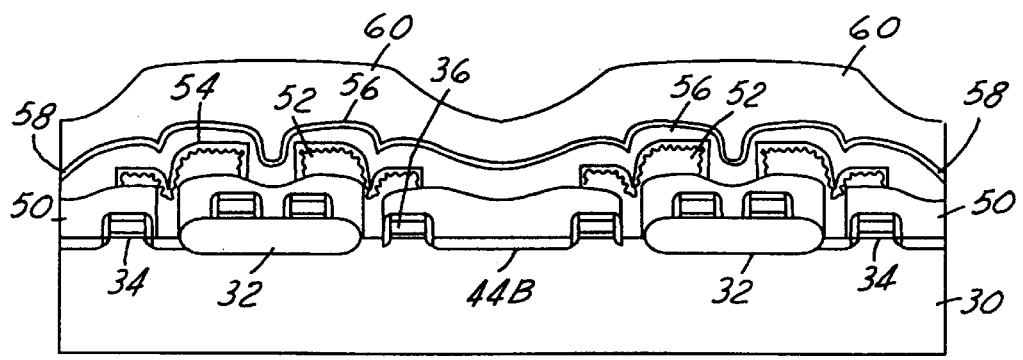
FIG. 8 is a cross-sectional view of the partially manufactured DRAM chip of FIG. 7 after the deposition of 3P, NSG and BPSG layers.

In the next step of the process, a thin layer of a dielectric material 54, a second doped polysilicon layer 56, a second insulating layer 58 and a third insulating layer 60 are sequentially deposited on top of the storage node 52. This is shown in FIG. 8. The capacitor dielectric layer 54 can be deposited of silicon oxynitride, silicon nitride, silicon dioxide or tantalum oxide. The second doped polysilicon layer 56 can be deposited by a technique similar to that used to deposit the first doped polysilicon layer 52. The second insulating layer 58 can be deposited of an undoped silicon dioxide by a low pressure chemical vapor deposition process by utilizing reactant gases of TEOS, $N_2O$ and $O_2$. The deposition is conducted at a temperature of 720° C., at a chamber pressure between about 200 and about 300 m Torr to a thickness between about 500 and about 1500 Å. The third insulating layer 60 can be deposited by a chemical vapor deposition process. It is usually a layer of borophosphorsilicate glass (BPSG) or a phosphor silicate glass (PSG) having a thickness between about 4000 and about 10,000 Å.

Figure 9:
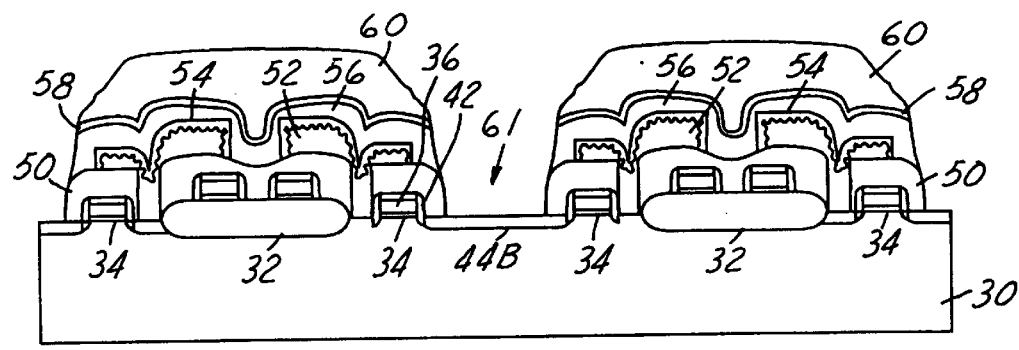
FIG. 9 is a cross-sectional view of the partially manufactured DRAM chip of FIG. 8 after an etching through BPSG, NSG and 3P layers.

Referring now to FIG. 9. By utilizing photolithography and plasma etching techniques, the third insulating layer 60, the second insulating layer 58, the second doped polysilicon layer 56 and the first insulating layer 50 are etched away to expose the surface of the source region 44B such that a bit line contact window 61 can be exposed. Simultaneously, a field plate 56 is formed on top of the capacitor. The plasma etching process for the third insulating layer 60, the second insulating layer 58 and the first insulating layer 50 can be carried out by a magnetic enhanced reactive ion etching process utilizing reactant gases of $CF_4$, $CHF_3$ and Ar. The plasma etching process for the second doped polysilicon layer 56 can be carried out by the same technique utilizing reactant gases of $CCl_4$, $Cl_2$ or HBr.

Figure 10:
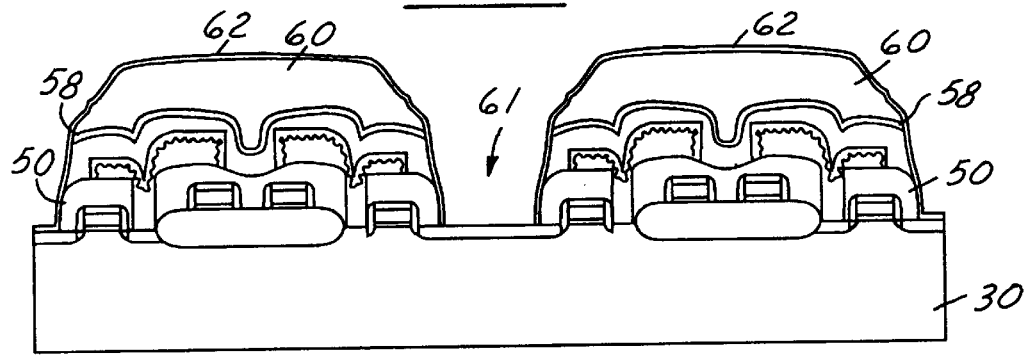
FIG. 10 is a cross-sectional view of the partially manufactured DRAM chip of FIG. 9 after the deposition of an insulating layer.
Figure 11:
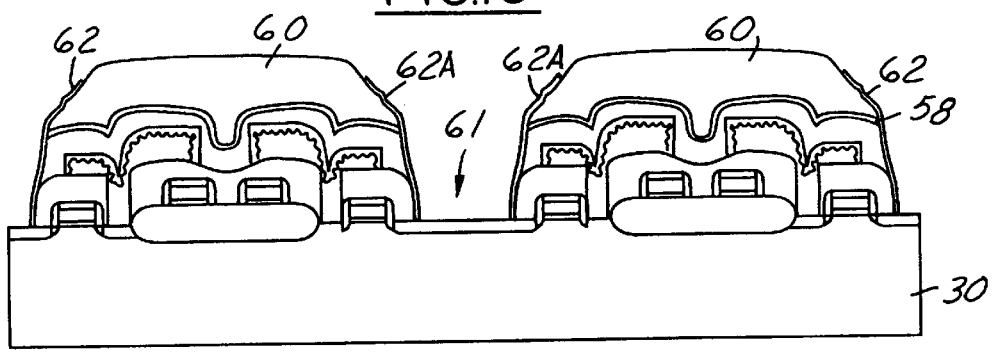
FIG. 11 is a cross-sectional view of the partially manufactured DRAM chip of FIG. 10 after an anisotropic etchback of the insulating layer.

Subsequently, a fourth insulating layer 62 is deposited on the structure as shown in FIG. 10. A plasma etching technique is used to conduct an anisotropical etchback process on the fourth insulating layer 62 such that the fourth insulator spacers 62A can be formed on the sidewalls of the bit line contact window 61. This is shown in FIG. 11. The fourth insulator spacer 62A insulates the second doped polysilicon layer 56 on the sidewalls of the bit line contact window 61. The fourth insulating layer 62 is generally silicon dioxide formed by a low pressure chemical vapor deposition technique by utilizing reactant gases of TEOS, $N_2O$ and $O_2$. The chemical vapor deposition process is conducted at a temperature of about 720° C. and a chamber pressure between about 200 and about 300 m Torr. The thickness of the layer 62 deposited is between about 800 and about 2500 Å. It should be pointed out that the second doped polysilicon layer 56 on the sidewall of the bit line contact window 61 can also be insulated by the following process. After the structure shown in FIG. 10 is completed, the second doped polysilicon layer 56 can be oxidized in a thermal oxidation process and then anisotropically etched by a plasma etching technique to etch away the silicon dioxide layer formed by the thermal oxidation process on the surface of the source region 44B.

Figure 12:
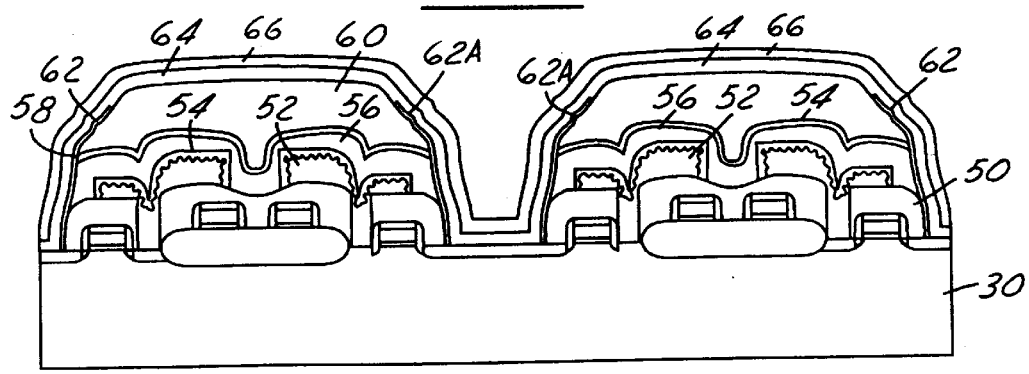
FIG. 12 is a cross-sectional view of the DRAM chip of FIG. 11 after the final deposition of a polycide layer.

In the final fabrication step, a third doped polysilicon layer 64 and a tungsten silicide layer 66 are sequentially deposited forming a tungsten polycide layer. The tungsten polycide layer is then etched through photolithography and plasma etching processes to form a bit lines. The bit line bridges over the bit line contact window 61 as shown in FIG. 12. A stacked DRAM having a high capacitance capacitor can thus be provided.

During the etch of $BL/N^+$ contact (2C etch), a low selectivity etchant of $CHF_3/CF_4$ etches away Poly-3 (3P) deposition 56 first (see FIG. 8). In this first etchant, the $CHF_3/CF_4$ solution has a ratio of approximately 1:5, 1 part $CHF_3$ to 5 parts $CF_4$. This first etchant is applied for approximately 180 seconds. And then a second etching process is performed by using a high Si selectivity etchant, which is $CHF_3/CF_4$ again but at different ratios, which etches away the residual oxide (see FIG. 8). In this second etchant, the $CHF_3/CF_4$ solution has a ratio of approximately 1:1, 1 part $CHF_3$ to 1 part $CF_4$. The second etchant is applied for approximately 90 seconds.

The exposed poly on the sidewall is isolated from the contact hole by oxidation or deposition (LPTEOS). The oxide formed on the substrate during oxidation is etched away by anisotropic etch. The self-alignment of BL-3P is thus achieved. The planar area of 2P can be increased by this method and not be limited by the overlap of 2C–3P.

By utilizing the method of the present invention, only the 2C–2G overlap needs to be considered. For instance, in a 0.45 $\mu$m device, the overlap between 2C–2G is about 0.566 $\mu$m.

The method of the present invention has illustrated a solid state memory fabrication method of DRAM chips with a self-alignment of field plate/BL isolation process includes using oxide-poly-oxide etch followed by oxidation or sidewall deposition (LPTEOS) to isolate the field plate and BL. This method uses a first etchant and a second etchant, both containing the same etchants but in different ratios and applied for different times, in etching the $BL/N^+$ contact in the fabrication process. During the etch of $BL/N^+$ contact (2C etch), a low selectivity etchant etches away Ploy-3 first. This first etchant is applied for approximately one hundred eighty seconds. And then a second etching process is performed using a high Si selectivity etchant, which etches away the residual oxide. The second etchant is applied for approximately ninety seconds. The exposed poly on the sidewall is isolated from the contact hole by oxidation or deposition (LPTEOS). The oxide formed on the substrate over the $BL/N^+$ contact during oxidation is etched away by anisotropic etch. Thus the self-alignment of BL-3P is achieved. The planar area of 2P can be increased by this method and not be limited by the overlap of 2C–3P.

While there has been illustrated and described a particular embodiment of the present invention, it will be appreciated that numerous changes and modifications will occur to those skilled in the art, and it is intended in the appended claims to cover all those changes and modifications which fall within the true spirit and scope of the present invention.

We claim:

1. A fabrication method of DRAM chips by a self-alignment of field plate/bit line (BL) isolation process comprising the steps of:

providing a high Si selectivity etchant which etches away residual oxide in a first etching step, providing a low Si selectivity etchant for etching away a polysilicon layer during an etch of $BL/N^+$ contact in a second etching step; and applying a sidewall deposition to isolate the field plate and bit line.

2. The method according to claim 1 wherein said step of providing a low Si selectivity etchant includes:

applying said low Si selectivity etchant for approximately one hundred eighty seconds.

3. The method according to claim 2 wherein said step of applying said low Si selectivity etchant includes:

using said low Si selectivity etchant of $CHF_3/CF_4$ having a ratio of approximately one part $CHF_3$ to five parts $CF_4$.

4. The method according to claim 1 wherein said step of providing a high Si selectivity etchant includes:

applying said high Si selectivity etchant for approximately ninety seconds.

5. The method according to claim 1 wherein said step of providing a high Si selectivity etchant includes:

using said high Si selectivity etchant of $CHF_3/CF_4$ having a ratio of approximately one part $CHF_3$ to one part $CF_4$.

6. A fabrication method of DRAM chips by a self-alignment of field plate/bit line (BL) isolation process comprising the steps of:

providing a high Si selectivity etchant which etches away residual oxide in a first etching step, providing a low Si selectivity etchant for etching away a polysilicon layer during an etch of $BL/N^+$ contact in a second etching step;

applying a sidewall deposition to isolate the field plate and bit line, and etching away an oxide layer formed on the substrate during oxidation.

7. The method according to claim 6 wherein said etching away step includes applying an anisotropic etch.

8. A DRAM chip fabricated according to the method of claim 1.

\* \* \* \* \*